(12) United States Patent
Kumazawa et al.

(10) Patent No.: US 8,415,794 B2
(45) Date of Patent: Apr. 9, 2013

(54) SEMICONDUCTOR DEVICE HAVING STABLE SIGNAL TRANSMISSION AT HIGH SPEED AND HIGH FREQUENCY

(75) Inventors: Kentaro Kumazawa, Osaka (JP); Yoshihiro Tomura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/989,777

(22) PCT Filed: Apr. 14, 2009

(86) PCT No.: PCT/JP2009/001724
§ 371 (c)(1),
(2), (4) Date: Oct. 26, 2010

(87) PCT Pub. No.: WO2009/136468
PCT Pub. Date: Nov. 12, 2009

(65) Prior Publication Data
US 2011/0042808 A1 Feb. 24, 2011

(30) Foreign Application Priority Data

May 9, 2008 (JP) .................................. 2008-123645

(51) Int. Cl.
*H01L 23/48* (2006.01)
*H01L 23/52* (2006.01)
*H01L 29/40* (2006.01)

(52) U.S. Cl.
USPC ........... 257/737; 257/778; 257/686; 257/781; 257/783; 438/108; 438/109; 438/614

(58) Field of Classification Search .................. 257/777, 257/686, 723, 737, 738, 778, 779, 780, 734, 257/E23.021, 781, 782, 783, 786, 678, 690; 438/106, 108, 109, 110, 118, 612, 613, 614
See application file for complete search history.

(56) References Cited

U.S. PATENT DOCUMENTS

| 5,404,265 | A | 4/1995 | Moresco et al. |
| 7,335,995 | B2 * | 2/2008 | Pflughaupt et al. ............ 257/779 |
| 2005/0258529 | A1 * | 11/2005 | Green et al. ................... 257/686 |
| 2006/0102996 | A1 * | 5/2006 | Han et al. ....................... 257/686 |
| 2007/0080468 | A1 | 4/2007 | Kamiya |
| 2007/0216027 | A1 | 9/2007 | Okamura |

FOREIGN PATENT DOCUMENTS

| GB | 2 206 221 A | 12/1988 |
| JP | 63-252447 | 10/1988 |
| JP | 06-224257 | 8/1994 |
| JP | 2003-059966 | 2/2003 |
| JP | 2006-344896 | 12/2006 |
| JP | 2007-250760 | 9/2007 |

* cited by examiner

*Primary Examiner* — Thanh Y Tran
(74) *Attorney, Agent, or Firm* — McDermott Will & Emery LLP

(57) ABSTRACT

A semiconductor device includes a semiconductor element having a plurality of element electrodes formed thereon, a circuit board having board electrodes respectively corresponding to the element electrodes formed thereon and having the semiconductor element mounted thereon, and bumps each of which is provided on at least one of the element electrode and the board electrode, and connects together the element electrode and the board electrode corresponding to each other when the semiconductor element is mounted on the circuit board. Furthermore, at least one of a dielectric layer and a resistive layer is provided between at least one of the bumps and the element or board electrode on which the at least one of the bumps is provided, so that the element or board electrode, the dielectric layer or the resistive layer, and the bump form a parallel-plate capacitor or electrical resistance.

8 Claims, 13 Drawing Sheets

SEMICONDUCTOR DEVICE HAVING STABLE SIGNAL TRANSMISSION AT HIGH SPEED AND HIGH FREQUENCY

RELATED APPLICATIONS

This application is the U.S. National Phase under 35 U.S.C. §371 of International Application No. PCT/JP2009/001724, filed on Apr. 14, 2009, which in turn claims the benefit of Japanese Application No. 2008-123645, filed on May 9, 2008, the disclosures of which Applications are incorporated by reference herein.

TECHNICAL FIELD

The present invention relates to semiconductor devices and methods for manufacturing the same, particularly to a semiconductor device structured by connecting a semiconductor element and a circuit board.

BACKGROUND ART

Semiconductor devices are used in a wide range of fields including the consumer field. With strong demand for reduction in size and weight as well as increase in functions of various products using the semiconductor device, recent years have seen a further increasing trend to higher integration and higher-speed operation. In particular, to address higher-speed operation of products using the semiconductor device, the semiconductor device handles higher-frequency signals. In such a high-frequency signal region, noise produces a notable effect on signal transmission, and therefore it is highly important to deal with such noise. In a general design, a capacitive component (bypass capacitor) is mounted at a stage previous to an input to/output from a semiconductor element, thereby reducing the effect of noise to ensure stable high-frequency characteristics.

FIGS. 20A and 20B illustrate an example of mounting a capacitive component of a conventional semiconductor device. The semiconductor device 20 shown in the figures has a wiring pattern included in an integrated circuit formed on a wiring-side surface of a semiconductor element 21. The wiring pattern includes an electrode portion (element electrode, not shown) having projecting electrodes (bumps) 23 previously formed by, for example, ball bonding or plating. The semiconductor element 21 and a circuit board 22 are positioned such that the bumps 23 are opposed to their corresponding board electrodes 24 of the circuit board 22, and the bumps 23 are joined to the board electrodes 24 by placing the semiconductor element 21 on the circuit board 22. In this manner, the semiconductor device 20 is formed. In addition, a capacitive component 25 is mounted on an input/output wire for the semiconductor element 21 on the circuit board 22, thereby ensuring stable high-frequency characteristics.

However, the demand for size reduction of products using the semiconductor device requires further size reduction of the circuit board, making it increasingly difficult to mount the capacitive component on the input/output wire for the semiconductor element on the circuit board. In particular, as the functionality of the semiconductor element increases, the number of input/output terminals is tremendously increased, while the demand for size reduction of the semiconductor element requires a number of input/output terminals to be provided in a smaller area. Therefore, the wiring pitch for input/output terminals is further reduced, making it increasingly difficult to mount capacitive components on the circuit board.

Here, to eliminate the effect of noise on the semiconductor element, the capacitive component is preferably positioned as close to the semiconductor element as possible. However, if the semiconductor element is further enhanced in speed in the future, providing the capacitive component in a position close to the semiconductor element is expected to become further difficult because there is a limit in shortening wires to be arranged. Specifically, if wires for providing capacitive components are lengthened, the wires also pick up noise, impairing high-frequency characteristics and the stability thereof. Therefore, such wires are required to be as short as possible.

In this regard, for example, Patent Document 1 proposes to structure capacitors by forming dielectric layers on top of bumps for connecting element electrodes of a semiconductor element and board electrodes of a circuit board (see FIG. 1 of Patent Document 1).

Also, Patent Document 2 proposes to provide a capacitive film between electrodes and an uppermost wiring layer in a silicon board having multi-level wiring layers (see FIG. 1 of Patent Document 2).

Also, Patent Document 3 proposes to provide capacitance components by forming space between bumps and electrodes opposed thereto (see FIG. 1 of Patent Document 3).

Patent Document 1: Japanese Laid-Open Patent Publication No. 6-224257
Patent Document 2: Japanese Laid-Open Patent Publication No. 2007-250760
Patent Document 3: Japanese Laid-Open Patent Publication No. 2003-59966

DISCLOSURE OF THE INVENTION

Problem to be Solved by the Invention

However, in the approach of Patent Document 1, the bumps are joined to their opposing electrodes with the dielectric layers formed on the bumps. An operation of joining the bumps and the opposing electrodes is performed with the bumps being pressed upon the electrodes under a certain pressure, and therefore the proposed approach has difficulty in joining the bumps and the electrodes while keeping the dielectric layers at a desired thickness. As a result, a desired capacitance is not ensured, so that desired high-frequency characteristics cannot be achieved in signal transmission. That is, at present, the proposed approach is conceivably difficult to put into practical use.

Also, the approach of Patent Document 2 requires the capacitive film to be previously incorporated in the semiconductor board, and therefore it is not possible to freely change the position in which to provide the capacitive film. As a result, when a design change or suchlike occurs, it is necessary to use a new semiconductor board with a changed position in which to incorporate the capacitive film. Accordingly, the semiconductor device proposed by the Patent Document 2 has a low degree of freedom in design.

Also, in the approach of Patent Document 3, the capacitance components are generated by the bumps, the opposing electrodes, and gaps therebetween, but in actuality, it is difficult to adjust such gaps with precision. Accordingly, in actuality, it is difficult to obtain a desired capacitance. In addition, the capacitance fluctuates in accordance with variations in size of the gaps, and therefore it is also difficult to obtain stable capacitance components.

The present invention has been made in view of such problems, and an objective thereof is to provide a semiconductor device capable of reliably achieving stable signal transmission while minimizing production cost increase.

Means for Solving the Problem

To attain the objective mentioned above, a semiconductor device is provided, comprising:

a semiconductor element having a plurality of element electrodes formed thereon;

a circuit board having board electrodes respectively corresponding to the element electrodes formed thereon and having the semiconductor element mounted thereon; and bumps each of which is provided on at least one of the element electrode and the board electrode, and connects together the element electrode and the board electrode corresponding to each other when the semiconductor element is mounted on the circuit board, wherein, at least one of a dielectric layer and a resistive layer is provided between at least one of the bumps and the element or board electrode on which the at least one of the bumps is provided.

In a semiconductor device according to a preferred embodiment of the invention, the dielectric layer and the resistive layer have larger plane areas than the element or board electrode that has the dielectric or resistive layer provided thereon.

In a semiconductor device according to another preferred embodiment of the invention, the element electrode and the board electrode have their opposing surfaces formed simply by single flat surfaces.

In another preferred embodiment of the invention, the semiconductor device further comprises a first conductive layer between the dielectric or resistive layer and the element or board electrode that has the dielectric or resistive layer provided thereon.

In a semiconductor device according to another preferred embodiment of the invention, the dielectric layer is provided between at least one of the bumps and the element or board electrode that has the at least one bump provided thereon, and the resistive layer is provided between at least another one of the bumps and the element or board electrode that has the at least another one bump provided thereon.

In a semiconductor device according to another preferred embodiment of the invention, the first conductive layer has a plane area larger than an area of a junction with the element or board electrode that has the first conductive layer provided thereon.

In a semiconductor device according to another preferred embodiment of the invention, at least one first conductive layer is opposed to at least another one first conductive layer with the dielectric layer disposed therebetween.

In a semiconductor device according to another preferred embodiment of the invention, the dielectric layer has a plane area equal to that of the first conductive layer, and a second conductive layer is provided between a bump and the dielectric layer, the second conductive layer having a plane area approximately equal to that of the first conductive layer.

In a semiconductor device according to another preferred embodiment of the invention, each of the bumps has its surface bonded to the second conductive layer such that the surface's center is not located on the element or board electrode that has the bump provided thereon.

In a semiconductor device according to another preferred embodiment of the invention, a plurality of bumps are provided corresponding to one of the element or board electrodes, the dielectric layer is provided between at least one of the bumps and the first conductive layer, and the resistive layer is provided between at least another one of the bumps and the first conductive layer.

In a semiconductor device according to another preferred embodiment of the invention, the first conductive layer is provided to interconnect a plurality of the element and board electrodes, the dielectric layer is provided on at least one of the interconnected element and board electrodes via the first conductive layer, and the resistive layer is provided on at least another one of the interconnected element and board electrodes.

In a semiconductor device according to another preferred embodiment of the invention, the dielectric layer is formed by providing a protective film made of an insulator on the element electrodes, the protective film protecting the surface of the semiconductor element.

In a semiconductor device according to another preferred embodiment of the invention, the bumps are formed of a softer material than the first conductive layer.

In a semiconductor device according to another preferred embodiment of the invention, the bumps are provided on the element electrodes and connected to the board electrodes by bonding wires.

The present invention also provides a semiconductor device manufacturing method, wherein bumps are at least formed on either element electrodes of a semiconductor element or board electrodes of a circuit board, and either a dielectric layer or a resistive layer is at least formed between at least one of the bumps and the element or board electrode that has the at least one bump formed thereon.

Effect of the Invention

In the semiconductor device of the present invention, either the dielectric layer or the resistive layer, or both, is at least provided between the element electrode or the board electrode and the bump, between the first conductive layer and the bump, between the first conductive layer and the second conductive layer, or between the first conductive layers, so that either the parallel-plate capacitor or the resistor, or both, is at least formed. As a result, it becomes possible to incorporate a parallel-plate capacitor or a resistor into the connection means itself, which uses the bumps for connecting the element electrodes of the semiconductor element and the board electrodes of the circuit board. Accordingly, it is possible to provide capacitive components (bypass capacitors) and resistors in positions very close to the semiconductor element without providing space for special use. Thus, it is possible to achieve stable signal transmission in a semiconductor device which is particularly required to operate at high speed and at high frequency.

Also, the capacitance of the parallel-plate capacitor can be readily regulated by changing, for example, the thickness of the dielectric layer, the areas of conductive materials having the dielectric layer therebetween, or the material of the dielectric layer. In addition, the resistance value of the resistor can also be readily regulated by changing the thickness, cross-section area or material of the resistive layer. Thus, it is possible to incorporate a parallel-plate capacitor with an arbitrary capacitance and a resistor with an arbitrary resistance value into the connection means itself so as to conform to the electric design of the semiconductor device.

Also, the dielectric layer is provided with its top surface covered with a conductive material rather than being left exposed on top of the bump. As a result, for example, it is possible to avoid the dielectric layer changing in thickness when joining the bump to its corresponding electrode. Thus, it is possible to readily form a parallel-plate capacitor with a desired capacitance.

Furthermore, when forming bumps on element electrodes or board electrodes, the dielectric layer or the resistive layer can be provided on an arbitrarily selected element or board electrode. Thus, even when a design change or suchlike occurs, it is possible to flexibly deal with such a change by incorporating the parallel-plate capacitor or the resistor in a position on the circuit where it is required in accordance with the change.

In addition, by providing the capacitive component in combination with the resistor, further stable signal transmission can be achieved. Moreover, since the need to provide additional capacitive components as in conventional semiconductor devices is eliminated, it is possible to enhance ease of mounting of semiconductor elements onto the circuit board. As a result, cost reduction can also be achieved.

BEST MODE FOR CARRYING OUT THE INVENTION

Hereinafter, embodiments of the present invention will be described in detail with reference to the drawings.

Embodiment 1

Figure 1:
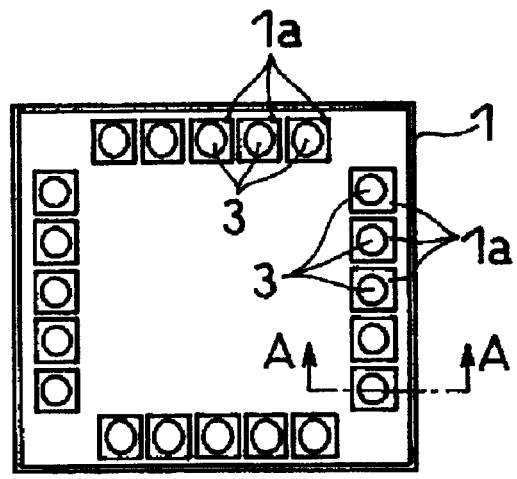
FIG. 1 is a plan view for the wiring surface side of a semiconductor element of a semiconductor device according to Embodiment 1 of the present invention.
Figure 2:
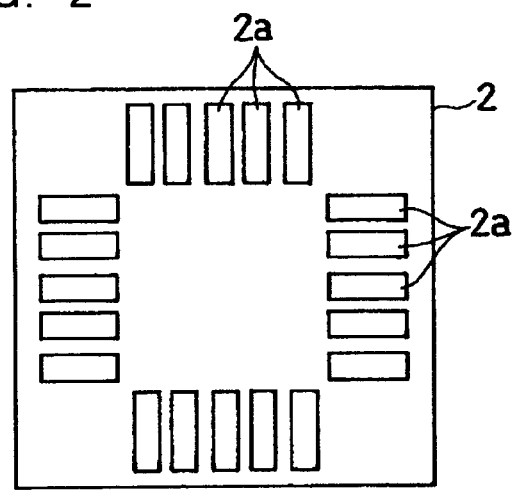
FIG. 2 is a plan view for the wiring surface side of a circuit board of the semiconductor device.

FIG. 1 is a plan view of a semiconductor element of a semiconductor device according to Embodiment 1 of the present invention, and FIG. 2 is a plan view of a circuit board of the semiconductor device.

The semiconductor element 1 shown in FIG. 1 has an integrated circuit formed on a silicon board, including a plurality of element electrodes 1a. The circuit board 2 shown in FIG. 2 has board electrodes 2a corresponding to the element electrodes 1a of the semiconductor element 1. Each element electrode 1a of the semiconductor element 1 has a bump 3 formed as a projecting electrode.

Figure 3:
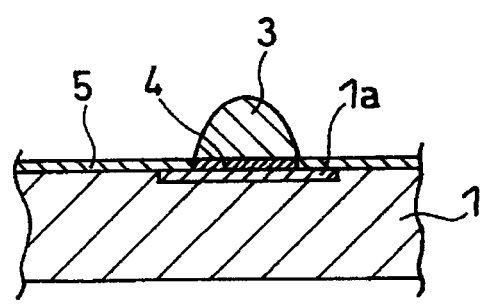
FIG. 3 illustrates a cross section taken along line A-A of FIG. 1.

FIG. 3 illustrates a cross section of the semiconductor element taken along line A-A of FIG. 1. As shown in the figure, the semiconductor element 1 has a dielectric layer 4 formed in a uniform thickness on the element electrode 1a, and the bump 3 is formed on the dielectric layer 4 so as to be opposed to the element electrode 1a with the dielectric layer 4 disposed therebetween. Also, the surface of the semiconductor element 1 that has the element electrode 1a provided thereon, excluding a portion of the surface where the bump 3 is formed, is covered with a protective film 5 made of, for example, a thin film of polyimide.

Here, the dielectric layer 4 has a uniform thickness, so that the surface of the bump 3 that is opposed to the element electrode 1a is entirely parallel to the element electrode 1a. The dielectric layer 4 has a spreading shape having the same size as or being somewhat laterally broader than the surface of the bump 3 that is opposed to the element electrode 1a, and the element electrode 1a, the dielectric layer 4 and the bump 3 form a parallel-plate capacitor. The surface of the element electrode 1a that is opposed to the bump 3 or the board electrode 2a is also a single surface flattened to form the parallel-plate capacitor. Here, the dielectric layer 4 preferably has a plane area 1.2 to 1.3 times the area of the element electrode 1a, so that the bump 3 and the element electrode 1a can be prevented from being shorted, for example, when the bump 3 is formed out of position.

For example, when the surface of the bump 3 that is opposed to the element electrode 1a has a diameter of 50 μm, i.e., the surface of the bump 3 that is opposed to the element electrode 1a has an area of about 1,962 $(25 \times 25 \times 3.14)$ μm$^2$, and the dielectric layer 4 is made of 0.1 μm-thick epoxy resin, the parallel-plate capacitor functions as a capacitor having a capacitance of about 1 pF. Note that the capacitance is calculated using a dielectric constant of the epoxy resin as about $2.6 \times 10^{-12}$ F/m.

Also, the capacitance of the parallel-plate capacitor can be regulated by changing the thickness of the dielectric layer 4. For example, when the bump 3 has the above diameter, the thickness of the dielectric layer 4 is regulated within the range from 1 μm to 1 nm, thereby regulating the capacitance within the range from 1 to 87 pF.

Also, the dielectric layer 4 can be made of a material not limited to epoxy resin, e.g., metal oxide. The capacitance of the parallel-plate capacitor can also be changed by changing the material. For example, the capacitance is increased by using barium titanate as the material of the dielectric layer 4, and in this case, by regulating the thickness of the dielectric layer 4 within the range from 1 μm to 1 nm with the bump 3 having the above diameter, the capacitance can be regulated within the range from 6 to 6600 pF. Also, by using silicon oxide ($SiO_2$) as the material of the dielectric layer 4, the dielectric layer 4 can be formed at low cost.

Figure 4A:
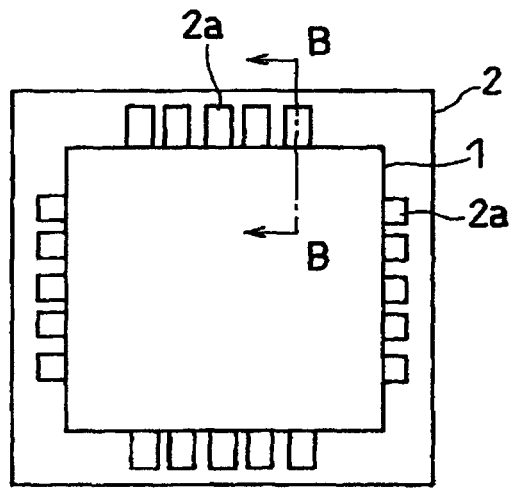
FIG. 4A is a plan view of the semiconductor element of FIG. 1 mounted on the circuit board of FIG. 2 as viewed from the semiconductor element side.
Figure 4B:
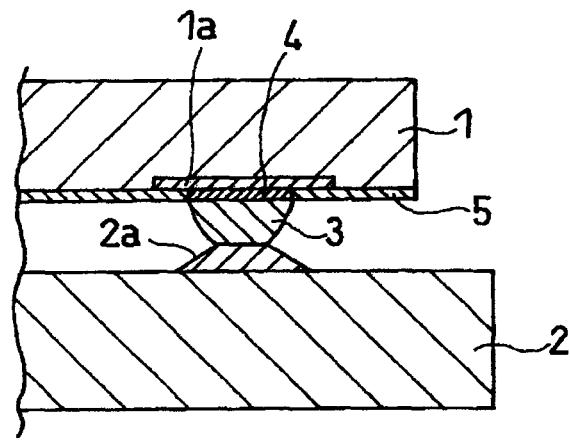
FIG. 4B is a cross-sectional view of a substantial portion where the semiconductor element of FIG. 1 is mounted on the circuit board of FIG. 2.

FIGS. 4A and 4B illustrate the semiconductor element being mounted on the circuit board. FIG. 4A is a plan view of the semiconductor element mounted on the circuit board as viewed from the semiconductor element side. FIG. 4B is a cross-sectional view taken along line B-B of FIG. 4A.

As shown in FIGS. 4A and 4B, the semiconductor element 1 is placed face-down on the circuit board 2 such that the bumps 3 of the element electrodes 1a are brought into contact with their corresponding board electrodes 2a. In this state, a certain load is applied to join the bumps 3 and the board electrodes 2a. As a result, the corresponding element electrodes 1a are connected to the board electrodes 2a via the bumps 3.

As described above, according to Embodiment 1, the bumps 3 are provided on the element electrodes 1a with the dielectric layers 4 disposed therebetween, making it possible to incorporate a parallel-plate capacitor into the connection means itself, which uses the bumps 3 for connecting the element electrodes 1a and the board electrodes 2a. Thus, it is possible to omit capacitive components (bypass capacitors) which are conventionally mounted as additional components on the circuit board for the purpose of improving input/output pass characteristics by connecting semiconductor elements to the circuit board.

Furthermore, when compared to the case where capacitive components are provided as additional components, the capacitive components can be placed in positions closer to the semiconductor element 1. Thus, it is possible to stabilize characteristics of the semiconductor element 1, i.e., stable high-frequency signal transmission between the semiconductor element 1 and the circuit board 2. Also, by omitting capacitive components as additional components, it becomes possible to reduce the number of components and cost. In addition, a circuit composed of semiconductor elements and capacitors as in a memory card can be readily structured by interposing dielectric layers between bumps and element electrodes as described above.

Here, the bumps 3 can be formed by vapor deposition, plating, or printing, but it is particularly preferable to form them using a dispersion liquid obtained by dispersing conducting particles in photo-curable resin. In a conceivable method for forming the bumps 3 using the dispersion liquid, for example, a semiconductor element or a circuit board is shallowly immersed in the dispersion liquid and a predetermined portion thereof is irradiated with light through a mask, thereby forming an ultrathin resin layer including conducting particles, which are repeated to form the bumps. In the case of using such a method to form the bumps 3, the dielectric layers 4 can be similarly formed using photo-curable resin free of conducting particles. Accordingly, the bumps 3 and the dielectric layers 4 can be formed through similar steps using the same production equipment. As a result, it can suppress increase of semiconductor device production cost.

Embodiment 2

Figure 5A:
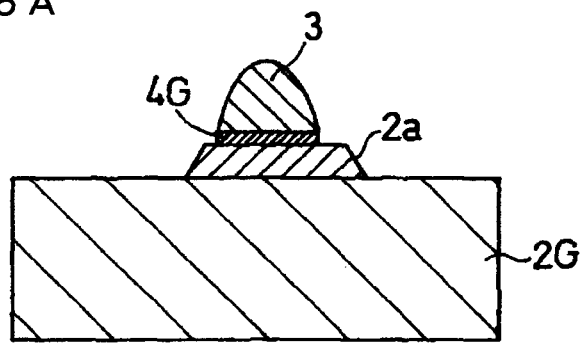
FIG. 5A is a cross-sectional view of a substantial portion of a semiconductor element of a semiconductor device according to Embodiment 2 of the present invention.
Figure 5B:
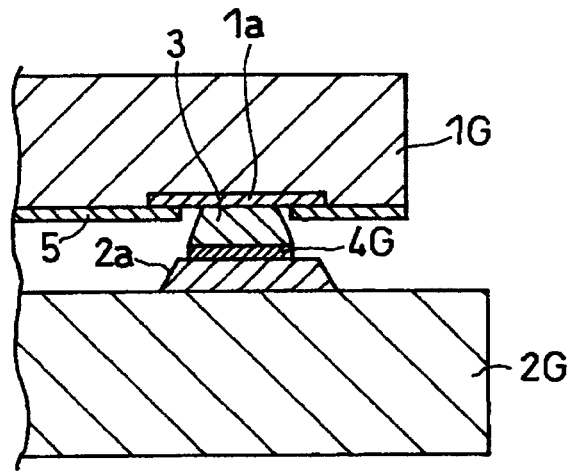
FIG. 5B is a cross-sectional view of a substantial portion where the semiconductor element is mounted on a circuit board.

Hereinafter, Embodiment 2 of the present invention will be described in detail with reference to FIGS. 5A and 5B. FIG. 5A is a cross-sectional view of a substantial portion of a circuit board of a semiconductor device according to Embodiment 2 of the present invention. FIG. 5B is a cross-sectional view of a substantial portion of the semiconductor element mounted on the circuit board of FIG. 5A.

As shown in FIGS. 5A and 5B, in Embodiment 2, dielectric layers 4G are formed on board electrodes 2a of the circuit board 2G, and each dielectric layer 4G has a bump 3 formed thereon so as to be opposed to the board electrode 2a with the dielectric layer 4G disposed therebetween.

Here, the dielectric layer 4G has a uniform thickness, so that the surface of the bump 3 that is opposed to the element electrode 2a is entirely parallel to the element electrode 2a. The dielectric layer 4 has a spreading shape having the same size as or being somewhat laterally broader than the surface of the bump 3 that is opposed to the element electrode 2a, and the element electrode 2a, the dielectric layer 4G and the bump 3 form a parallel-plate capacitor on the circuit board 2 side. The surface of the board electrode 2a that is opposed to the bump 3 or the element electrode 1a is also a single surface flattened to form the parallel-plate capacitor. Here, the dielectric layer 4 preferably has a plane area 1.2 to 1.3 times the area of the board electrode 2a, so that the bump 3 and the board electrode 2a can be prevented from being shorted, for example, when the bump 3 is formed out of position.

In addition, the semiconductor element 1G is placed face-down on the circuit board 2G such that the element electrodes 1a are brought into contact with their respective bumps 3 of the corresponding board electrodes 2a. In this state, a certain load is applied to join the bumps 3 and the element electrodes 1a. As a result, the corresponding element electrodes 1a are connected to the board electrodes 2a via the bumps 3. Other configurations are the same as in Embodiment 1.

As described above, the parallel-plate capacitor using the bumps 3 may be provided not only on the semiconductor element 1 side but also on the circuit board 2 side. It is also possible to provide the parallel-plate capacitor using the bumps 3 on both the semiconductor element 1 and the circuit board 2.

Embodiment 3

Figure 6A:
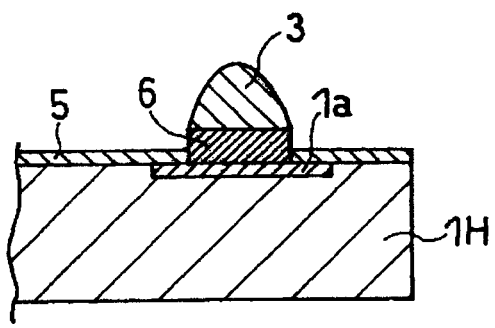
FIG. 6A is a cross-sectional view of a substantial portion of a semiconductor element of a semiconductor device according to Embodiment 3 of the present invention.
Figure 6B:
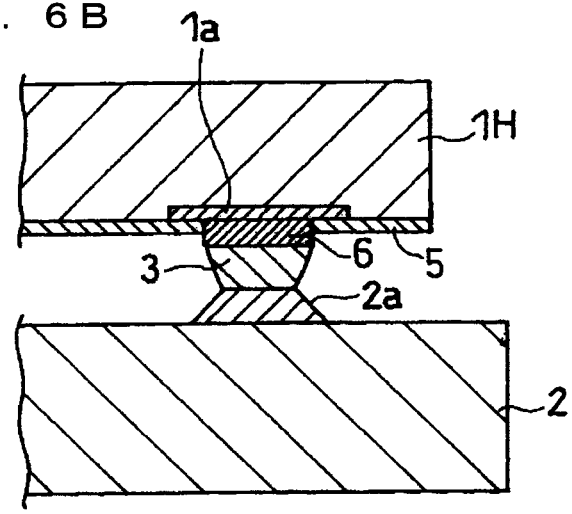
FIG. 6B is a cross-sectional view of a substantial portion where the semiconductor element is mounted on a circuit board.

Hereinafter, Embodiment 3 of the present invention will be described in detail with reference to FIGS. 6A and 6B. FIG. 6A is a cross-sectional view of a substantial portion of a semiconductor element of a semiconductor device according to Embodiment 3 of the present invention. FIG. 6B is a cross-sectional view of a substantial portion of the semiconductor element of FIG. 6A mounted on a circuit board.

As shown in FIGS. 6A and 6B, in Embodiment 3, resistive layers 6, in place of the dielectric layers 4, are formed on element electrodes 1a of semiconductor elements 1H, and each resistive layer 6 has a bump 3 formed thereon. Other configurations are the same as in Embodiment 1.

Here, for example, when the spreading shape of the resistive layer 6 has a diameter of 50 μm, i.e., the resistive layer 6 has a plane area of about 1,962 μm$^2$, and the material of the resistive layer 6 is a composite material having a resistivity of 1 Ωm, which is obtained by blending silver powder with epoxy resin, the resistive layer 6 having a thickness of 10 μm functions as a resistor having an electrical resistance of about 5 kΩ.

Also, the electrical resistance of the resistive layer 6 can be regulated by changing the thickness of the resistive layer 6. For example, when the resistive layer 6 has the above plane area, the thickness of the resistive layer 6 is regulated within the range from 1 to 30 μm, thereby regulating the electrical resistance within the range from 500 Ω to 15 kΩ.

Also, by changing the blending ratio of silver to epoxy resin in the composite material for the resistive layer 6, the resistivity of the resistive layer 6 can be regulated within the range from $1.6 \times 10^{-8}$ Ωm to $1 \times 10^{16}$ Ωm. Accordingly, by changing the thickness of the resistive layer 6 within the range from 1 μm to 30 μm, the electrical resistance can be regulated within the range from $8.2 \times 10^{-6}$ Ω to $1.5 \times 10^{20}$ Ω for the above area.

As described above, by forming the resistive layer 6 between the bump 3 and the element electrode 1a of the semiconductor element 1H, the electrical resistance can be disposed closer to the semiconductor element when connecting the semiconductor element to the circuit board, thereby shortening the length of wiring. As a result, the effect of noise can be reduced, and therefore it is possible to stabilize characteristics in the semiconductor element, i.e., it is possible to achieve stable high-frequency signal transmission between the semiconductor element and the circuit board. It becomes also possible to reduce the number of components and production cost.

Note that the resistive layer 6 and the bump 3 may be formed on the circuit board 2 side, i.e., both on the semiconductor element 1 and on the circuit board 2.

Embodiment 4

Figure 7A:
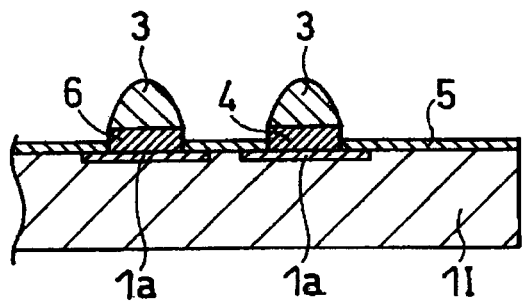
FIG. 7A is a cross-sectional view of a substantial portion of a semiconductor element of a semiconductor device according to Embodiment 4 of the present invention.
Figure 7B:
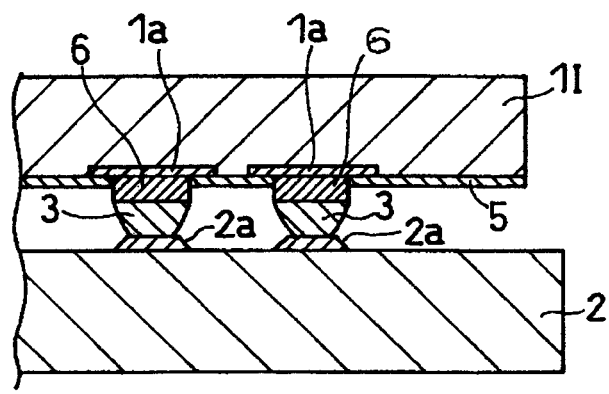
FIG. 7B is a cross-sectional view of a substantial portion where the semiconductor element is mounted on a circuit board.

Hereinafter, Embodiment 4 of the present invention will be described in detail with reference to FIGS. 7A and 7B. FIG. 7A is a cross-sectional view of a substantial portion of a semiconductor element of a semiconductor device according to Embodiment 4 of the present invention. FIG. 7B is a cross-sectional view of a substantial portion of the semiconductor element of FIG. 7A mounted on a circuit board.

As shown in FIGS. 7A and 7B, in the semiconductor device of Embodiment 4, a dielectric layer 4 is formed on at least one element electrode 1a of a semiconductor element 1I, and a bump 3 is formed so as to be opposed to the element electrode 1a with the dielectric layer 4 disposed therebetween. Also, a resistive layer 6 is formed on at least another one element electrode 1a of the semiconductor element 1I, and a bump 3 is formed on the resistive layer 6. Other configurations of the semiconductor device in Embodiment 4 are the same as in Embodiment 1.

According to Embodiment 4, the parallel-plate capacitor and the resistor can be formed on the connection means itself, which uses the bumps for interconnecting the semiconductor elements and their corresponding electrodes on the circuit board. Thus, it is possible to readily form, for example, a CPU arithmetic circuit and an analog signal amplification circuit in which transistors are often grounded via resistors and capacitors.

Note that the parallel-plate capacitor and the resistors that use bumps may be formed on the circuit board 2 side or on both the semiconductor element 1 and the circuit board 2. Alternatively, the parallel-plate capacitor using bumps may be formed on the semiconductor element 1I side and the resistors may be formed on the circuit board 2 side. The opposite is also possible.

Embodiment 5

Figure 8A:
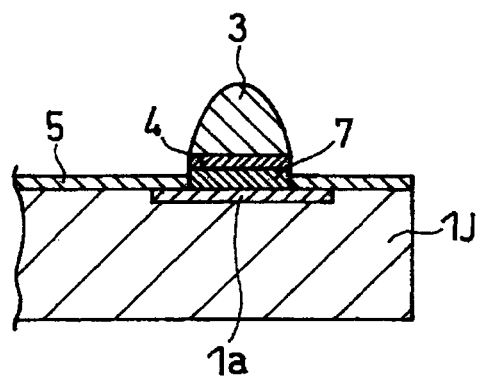
FIG. 8A is a cross-sectional view of a substantial portion of a semiconductor element of a semiconductor device according to Embodiment 5 of the present invention.
Figure 8B:
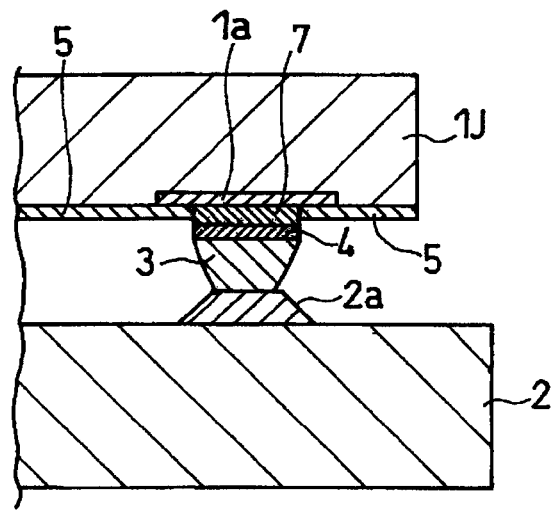
FIG. 8B is a cross-sectional view of a substantial portion where the semiconductor element is mounted on a circuit board.

Hereinafter, Embodiment 5 of the present invention will be described in detail with reference to FIGS. 8A and 8B. FIG. 8A is a cross-sectional view of a substantial portion of a semiconductor element of a semiconductor device according to Embodiment 5 of the present invention. FIG. 8B is a cross-sectional view of a substantial portion of the semiconductor element of FIG. 8A mounted on a circuit board.

As shown in FIGS. 8A and 8B, the semiconductor device of Embodiment 5 has first conductive layers 7 formed on element electrodes 1a of a semiconductor element 1J, each first conductive layer 7 having a dielectric layer 4 formed thereon and a bump 3 is formed so as to be opposed to the first conductive layer 7 with the dielectric layer 4 disposed therebetween.

Here, the surface of the bump 3 that is opposed to the first conductive layer 7 is entirely parallel to the first conductive layer 7. Other configurations are the same as in Embodiment 1.

Also, as described above, the first conductive layer 7 is preferably made of the same material as the bump 3. In this case, it is more preferable to form the first conductive layers 7 and the bumps 3 by the aforementioned method which uses a dispersion liquid obtained by dispersing conducting particles in photo-curable resin, because they can be formed using the same production equipment. It is more preferable to form the dielectric layers 4 using photo-curable resin having no conducting particles dispersed therein, because the dielectric layers 4 can be formed using the same production equipment as well.

Also, as is apparent from the foregoing descriptions, Embodiment 5 encompasses the case where the dielectric layers 4 are formed during formation of the bumps 3 on the element electrodes 1a of the semiconductor element 1J. Specifically, the present invention also encompasses the case where the bump 3 is halved into upper and lower portions by the dielectric layer 4. In such a case, the bump portion below the dielectric layer 4 (the portion being on the side of the element electrode 1a) corresponds to the first conductive layer 7, and the bump portion above the dielectric layer 4 (the portion being on the opposite side of the element electrode 1a) corresponds to the bump 3.

Here, for example, when the surface of the bump 3 that is opposed to the first conductive layer 7 has a diameter of 100 µm, i.e., the opposed surface has an area of about 7,850 (50×50×3.14) µm$^2$, the material of the dielectric layer 4 is epoxy resin having a relative dielectric constant of 5, and the dielectric layer 4 has a thickness of 0.1 µm, the bump 3, the dielectric layer 4 and the first conductive layer 7 function as a parallel-plate capacitor having a capacitance of about 3 pF.

The capacitance can be regulated by changing the thickness of the dielectric layer 4. For example, by regulating the thickness of the dielectric layer within the range from 1 µm to 1 nm, the capacitance can be regulated within the range from 0.3 to 350 pF.

Also, the capacitance can be increased by changing the material of the dielectric layer 4 to another material having a higher dielectric constant, e.g., barium titanate having a relative dielectric constant of 1200. In this case, when the bump 3 is sized as described above, the capacitance can be regulated within the range from 83 pF to 83000 µF by regulating the thickness of the dielectric layer 4 within the range from 1 µm to 1 nm.

Furthermore, the capacitance can be regulated within the range from 0.03 to 83000 pF by using a mixture of epoxy and alumina or barium titanate having a relative dielectric constant of 10 as the material of the dielectric layer 4 and changing the diameter of the bump 3 within the range from 30 to 100 µm.

Note that in Embodiment 5 also, the parallel-plate capacitor using the bumps 3 may be formed on the board electrodes 2a of the circuit board 2 or on both the element electrodes 1a of the semiconductor element 1J and the board electrodes 2a of the circuit board 2.

Embodiment 6

Figure 9A:
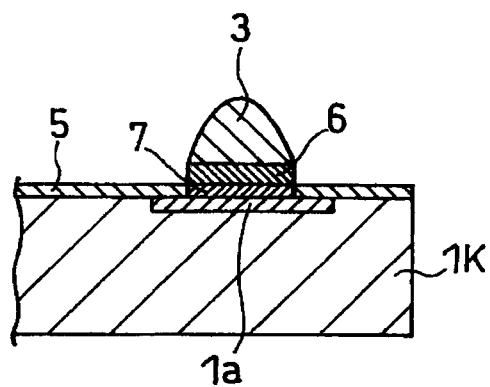
FIG. 9A is a cross-sectional view of a substantial portion of a semiconductor element of a semiconductor device according to Embodiment 6 of the present invention.
Figure 9B:
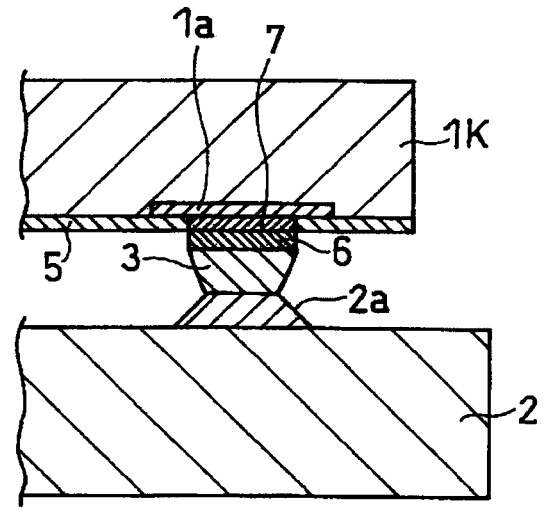
FIG. 9B is a cross-sectional view of a substantial portion where the semiconductor element is mounted on a circuit board.

Hereinafter, Embodiment 6 of the present invention will be described in detail with reference to FIGS. 9A and 9B. FIG. 9A is a cross-sectional view of a substantial portion of a semiconductor element of a semiconductor device according to Embodiment 6 of the present invention. FIG. 9B is a cross-sectional view of a substantial portion of the semiconductor element of FIG. 9A mounted on a circuit board.

As shown in FIGS. 9A and 9B, the semiconductor device of Embodiment 6 has first conductive layers 7 formed on element electrodes 1a of a semiconductor element 1K, each first conductive layer 7 having formed thereon a resistive layer 6 having a uniform thickness and further having a bump 3 formed thereon. Other configurations in Embodiment 6 are the same as in Embodiment 5.

Here, for example, when the spreading shape of the resistive layer 6 has a diameter of 50 µm, the material of the resistive layer 6 is a composite material having a resistivity of 1 Ωm, which is obtained by incorporating silver powder in epoxy resin, and the resistive layer 6 has a thickness of 10 µm, the resistive layer 6 functions as a resistor having an electrical resistance of about 5 kΩ.

The electrical resistance of the resistive layer 6 can be regulated by changing the thickness of the resistive layer 6. For example, the electrical resistance can be regulated within the range from 500 Ω to 15 kΩ by regulating the thickness of the resistive layer 6 within the range from 1 to 30 µm.

Also, the resistivity can be regulated within the range, for example, from $1.6 \times 10^{-8}$ to $1 \times 10^{16}$ Ωm by changing the blending ratio of silver to epoxy resin in the composite material. In this case, the electrical resistance can be regulated within the range from $8.2 \times 10^{-6}$ to $1.5 \times 10^{20}$ Ω by regulating the thickness of the resistive layer 6 within the range from 1 to 30 µm.

In this manner, by including the resistor in the connection means using the bumps 3, the resistor can be disposed closer to the semiconductor element 1K when connecting the semiconductor element to the circuit board. As a result, the length of wiring can be shortened, resulting in further reduced effect of noise. Thus, it is possible to stabilize characteristics of the semiconductor element 1K, i.e., it is possible to achieve stable high-frequency signal transmission between the semiconductor element 1K and the circuit board 2. It is also possible to reduce the number of components in the semiconductor device and production cost.

Note that in Embodiment 6 also, the first conductive layer 7 and the resistive layer 6 may be formed on the circuit board 2 side or on both the semiconductor element 1K and the circuit board 2. Furthermore, in Embodiment 6 also, the first conductive layer 7 is preferably made of the same material as the bump 3. In this case, it is more preferable to form the first conductive layers 7, the bumps 3 and the resistive layers 6 by the aforementioned method which uses a dispersion liquid obtained by dispersing conducting particles in photo-curable resin, because all of them can be formed using the same production equipment.

Embodiment 7

Figure 10A:
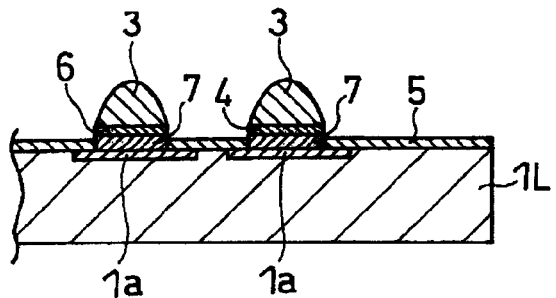
FIG. 10A is a cross-sectional view of a substantial portion of a semiconductor element of a semiconductor device according to Embodiment 7 of the present invention.
Figure 10B:
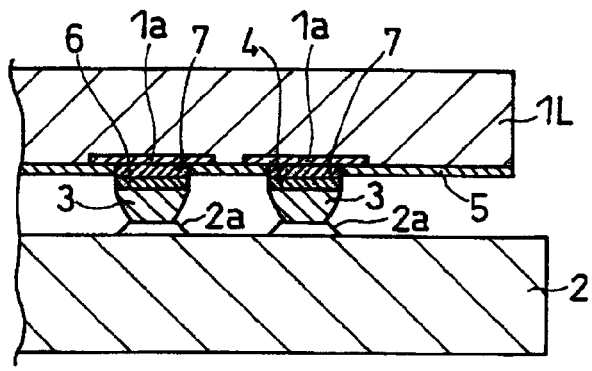
FIG. 10B is a cross-sectional view of a substantial portion where the semiconductor element is mounted on a circuit board.

Hereinafter, Embodiment 7 of the present invention will be described in detail with reference to FIGS. 10A and 10B. FIG. 10A is a cross-sectional view of a substantial portion of a semiconductor element of a semiconductor device according to Embodiment 7 of the present invention. FIG. 10B is a cross-sectional view of a substantial portion of the semiconductor element of FIG. 10A mounted on a circuit board.

As shown in FIGS. 10A and 10B, the semiconductor device of Embodiment 7 has a first conductive layer 7 formed on at least one element electrode 1a of a semiconductor element 1L, the first conductive layer 7 having a dielectric layer 4 formed thereon and further having a bump 3 formed so as to be opposed to the first conductive layer 7 with the dielectric layer 4 disposed therebetween. Also, a first conductive layer 7 is formed on at least another one element electrode 1a of the semiconductor element 1L, a resistive layer 6 is formed on the first conductive layer 7, and a bump 3 is formed on the resistive layer 6. Other configurations in Embodiment 7 are the same as in Embodiments 5 and 6.

According to the semiconductor device of Embodiment 7, it is possible to incorporate a capacitor with a capacitance and a resistor with an electrical resistance into the connection means itself, which uses the bumps 3 for connecting the element electrodes of the semiconductor element and the board electrodes of the circuit board. Accordingly, it is possible to readily form a circuit having both capacitors and electrical resistances. Thus, it is possible to readily form, for example, a CPU arithmetic circuit or an analog signal amplification circuit.

Note that in Embodiment 7 also, the parallel-plate capacitor using the bumps 3 and the resistors may be formed on the circuit board 2 side or on both the semiconductor element 1L and the circuit board 2. Also, the parallel-plate capacitor using the bumps 3 and the resistor can be formed on the semiconductor element 1L side and the circuit board 2 side, respectively, and vice versa. Furthermore, in Embodiment 7 also, the first conductive layer 7 is preferably made of the same material as the bump 3. In this case, it is more preferable to form the first conductive layers 7, the bumps 3 and the resistive layers 6 by the aforementioned method which uses a dispersion liquid obtained by dispersing conducting particles in photo-curable resin, because all of them can be formed using the same production equipment. It is more preferable to form the dielectric layers 4 using photo-curable resin having no conducting particles dispersed therein, because the dielectric layers 4 can be formed using the same production equipment as well.

Embodiment 8

Figure 11A:
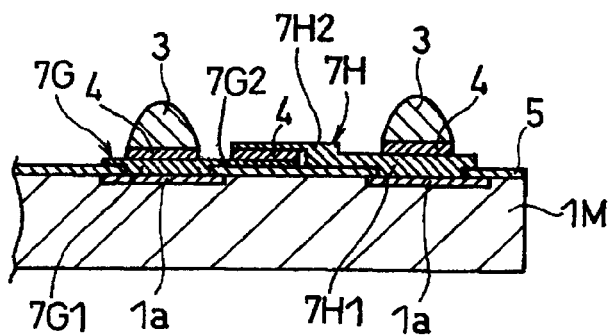
FIG. 11A is a cross-sectional view of a substantial portion of a semiconductor element of a semiconductor device according to Embodiment 8 of the present invention.
Figure 11B:
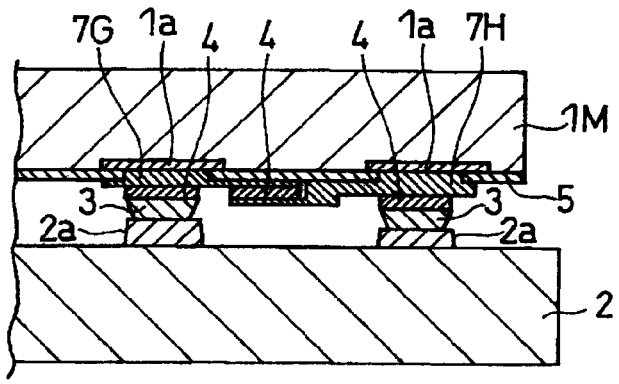
FIG. 11B is a cross-sectional view of a substantial portion where the semiconductor element is mounted on a circuit board.

Hereinafter, Embodiment 8 of the present invention will be described in detail with reference to FIGS. 11A and 11B. FIG. 11A is a cross-sectional view of a substantial portion of a semiconductor element of a semiconductor device according to Embodiment 8 of the present invention. FIG. 11B is a cross-sectional view of a substantial portion of the semiconductor element of FIG. 11A mounted on a circuit board.

As shown in FIGS. 11A and 11B, the semiconductor device of Embodiment 8 has a first conductive layer 7G formed on at least one element electrode 1a of a semiconductor element 1M, a first conductive layer 7H having a different shape is formed on at least another one element electrode 1a, each of the first conductive layers 7G and 7H having a dielectric layer 4 formed thereon and further having a bump 3 formed so as to be opposed to the first conductive layer 7G or 7H with the dielectric layer 4 disposed therebetween.

Here, the first conductive layer 7G or 7H includes a junction $7G_1$ or $7H_1$ with the element electrode 1a and a large-area portion $7G_2$ or $7H_2$, which extends from the junction $7G_1$ or $7H_1$ so as to project above the protective film 5. Also, the first conductive layers 7G and 7H have their respective large-area portions $7G_2$ and $7H_2$ partially overlapping in parallel, and another dielectric layer 4 having a uniform thickness is formed between the overlapping portions. As a result, another parallel-plate capacitor is formed between the first conductive layer 7G and the other first conductive layer 7H with a different shape. Other configurations in Embodiment 8 are the same as in Embodiment 5.

According to the semiconductor device of Embodiment 8, it is possible to incorporate a capacitor including a capacitance into the connection means itself, which uses bumps for connecting element electrodes of a semiconductor element to board electrodes of a circuit board, and it is also possible to connect any element electrodes 1a by the shortest distance via the capacitor including a capacitance. Thus, it is possible to enhance the stability of the high-frequency circuit.

Note that in Embodiment 8 also, the first conductive layers 7G and 7H, the dielectric layer 4, the bumps 3, and the other dielectric layer 4 may be formed on the circuit board 2 side or on both the semiconductor element 1M and the circuit board 2. Also, at least one or all of the two dielectric layers 4, including the aforementioned other dielectric layer 4, can be replaced with a resistive layer(s) 6. When at least one of the dielectric layers 4 is replaced with the resistive layer 6, a parallel circuit consisting of a resistor and a capacitor can be formed in the connection means itself, which uses the bumps, and therefore it is possible to further enhance the stability of the high-frequency circuit.

Embodiment 9

Figure 12A:
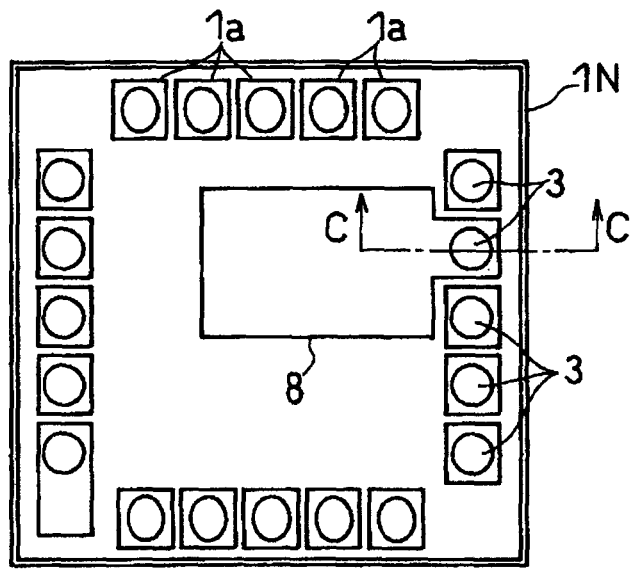
FIG. 12A is a plan view for the wiring surface side of a semiconductor element of a semiconductor device according to Embodiment 9 of the present invention.
Figure 12B:
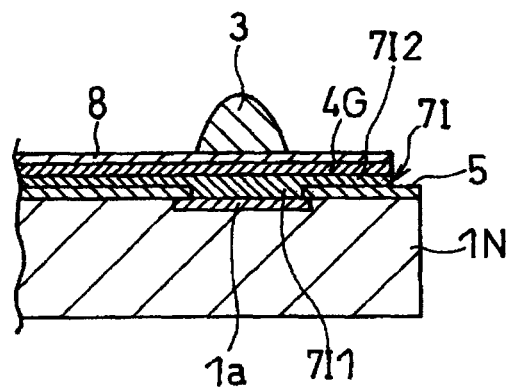
FIG. 12B is a cross-sectional view of a substantial portion of the semiconductor element.
Figure 12C:
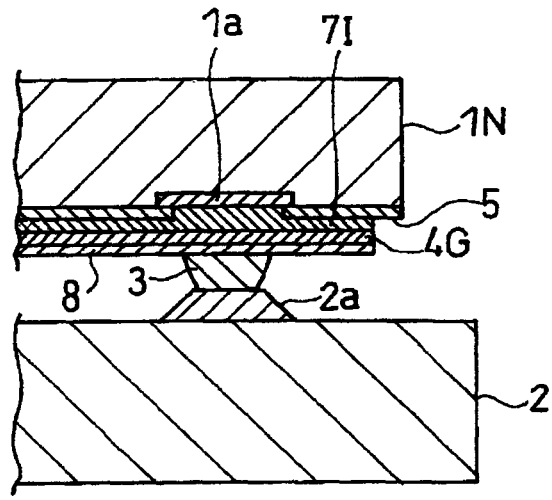
FIG. 12C is a cross-sectional view of a substantial portion where the semiconductor element is mounted on a circuit board.

Hereinafter, Embodiment 9 of the present invention will be described in detail with reference to FIGS. 12A, 12B and 12C. FIG. 12A is a plan view for the wiring surface side of a semiconductor element of a semiconductor device according to Embodiment 9 of the present invention. FIG. 12B is a cross-sectional view taken along line C-C of FIG. 12A. FIG. 12C is a cross-sectional view of a substantial portion of the semiconductor device where the semiconductor element of FIG. 12A is mounted on a circuit board.

As shown in FIGS. 12A, 12B and 12C, the semiconductor device of Embodiment 9 has first conductive layers 7I formed on the element electrodes 1a, each first conductive layer 7I having a dielectric layer 4G formed thereon, a second conductive layer 8 formed so as to be opposed to the first conductive layer 7I with the dielectric layer 4G disposed therebetween, and a bump 3 formed on the second conductive layer 8. Here, the first conductive layer 7I includes a junction $7I_1$ with the element electrode 1a and a large-area portion $7I_2$ extending so as to project above the protective film 5. Furthermore, the second conductive layer 8 is formed so as to have the same spreading shape as the large-area portion $7I_2$ of the first conductive layer 7I and is opposed to the large-area portion $7I_2$ of the first conductive layer 7I with its entire surface being parallel thereto.

According to the semiconductor device of Embodiment 9, it is possible to form a parallel-plate capacitor using a conducting member with a larger opposing area. As a result, a capacitor with a larger capacitance can be formed. For example, when the dielectric layer 4G has an area of 6.25 mm$^2$, the material of the dielectric layer 4G is epoxy resin having a relative dielectric constant of 5, and the dielectric layer 4G has a thickness of 0.1 μm, a capacitor having a capacitance of about 11 nF can be formed.

The capacitance can be regulated by changing the thickness of the dielectric layer 4G. For example, the capacitance can be regulated within the range from 1 nF to 1 μF by regulating the thickness of the dielectric layer 4G within the range from 1 μm to 1 nm.

Also, the capacitance can be increased by changing the material of the dielectric layer 4G to, for example, barium titanate having a high dielectric constant (a relative dielectric constant of 1200). In this case, the capacitance can be regulated within the range from 0.27 to 270 μF by regulating the thickness of the dielectric layer 4G within the range from 1 to 30 μm.

Note that in Embodiment 9 also, the first conductive layer 7I, the dielectric layer 4G and the second conductive layer 8 may be formed on the circuit board 2 side or on both the semiconductor element 1 and the circuit board 2.

Embodiment 10

Figure 13A:
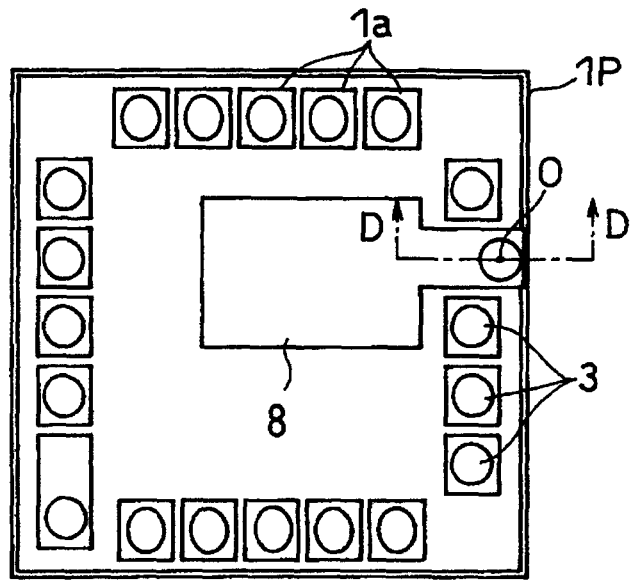
FIG. 13A is a plan view for the wiring surface side of a semiconductor element of a semiconductor device according to Embodiment 10 of the present invention.
Figure 13B:
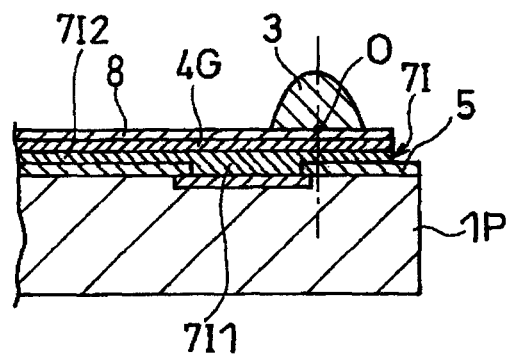
FIG. 13B is a cross-sectional view of a substantial portion of the semiconductor element.
Figure 13C:
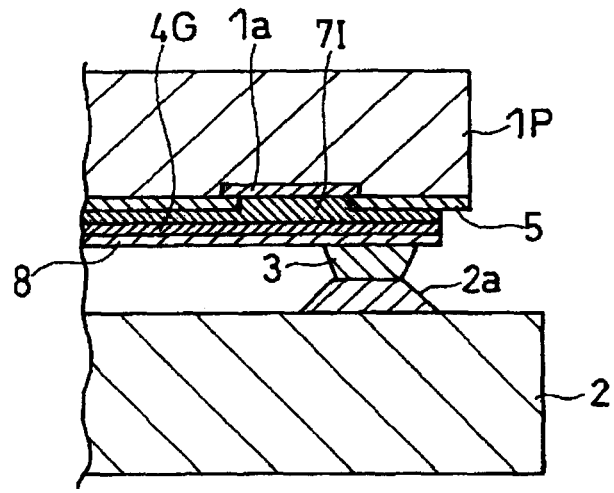
FIG. 13C is a cross-sectional view of a substantial portion where the semiconductor element is mounted on a circuit board.

Hereinafter, Embodiment 10 of the present invention will be described in detail with reference to FIGS. 13A, 13B and 13C. FIG. 13A is a plan view for the wiring surface side of a semiconductor element of a semiconductor device according to Embodiment 10 of the present invention. FIG. 13B is a cross-sectional view taken along line D-D of FIG. 13A. FIG. 13C is a cross-sectional view of a substantial portion where the semiconductor element of FIG. 13A is mounted on a circuit board.

As shown in FIGS. 13A, 13B and 13C, the semiconductor device of Embodiment 10 has first conductive layers 7I, which are similar to those of embodiment 9, formed on the element electrodes 1a, each first conductive layer 7I having formed thereon a dielectric layer 4G with the same spreading shape, and a second conductive layer 8 formed so as to be opposed to the first conductive layer 7I with respect to the dielectric layer 4G disposed therebetween. A bump 3 is formed on the second conductive layer 8.

Embodiment 10 differs from Embodiment 9 in that the position in which to provide the bump 3 does not lie just above the element electrode 1a. Specifically, in Embodiment 10, the bump 3 is provided such that the center O of the surface bonded to the second conductive layer 8 is not present on the element electrode 1a. As a result, the bump 3 is formed in a position not lying just above the element electrode 1a, which is a highly fragile component, resulting in increased reliability of the semiconductor device. Specifically, when connecting element electrodes 1a of a semiconductor element 1P to board electrodes 2a of a circuit board 2 using bumps 3, as described above, it is necessary to join the bumps 3 to the board electrodes 2a by pressing the bumps 3 on the board electrodes 2a with a certain pressure. Accordingly, there is not a little possibility that the element electrodes 1a might be damaged. Therefore, by providing the bumps 3 in positions not lying just above the element electrodes 1a, the element electrodes 1a can be prevented from being damaged when joining the bumps 3 to the board electrodes 2a, thereby increasing the reliability of the semiconductor device. Furthermore, by not limiting the position in which to provide the bump 3 to the position just above the element electrode 1a, the degree of freedom in design is increased.

Here, the capacitance of the capacitor formed by the first conductive layer 7I, the dielectric layer 4G and the second conductive layer 8 can be freely regulated in the same manner as in Embodiment 9. Note that in Embodiment 10 also, the first conductive layer 7G, the dielectric layer 4G and the second conductive layer 8 may be formed on the circuit board 2 side or on both the semiconductor element 1P and the circuit board 2.

Embodiment 11

Figure 14A:
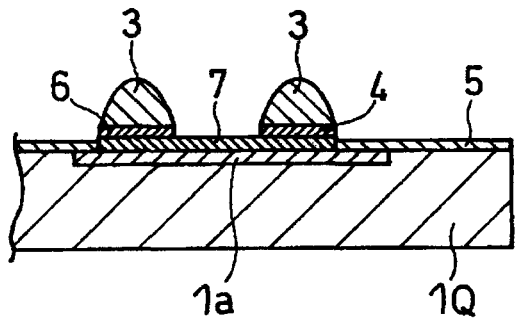
FIG. 14A is a cross-sectional view of a substantial portion of a semiconductor element of a semiconductor device according to Embodiment 11 of the present invention.
Figure 14B:
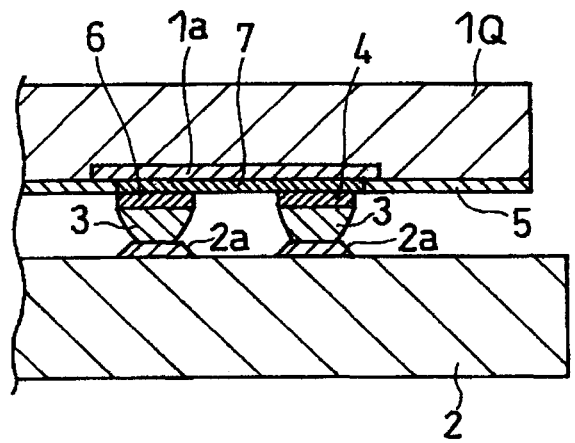
FIG. 14B is a cross-sectional view of a substantial portion where the semiconductor element is mounted on a circuit board.

Hereinafter, Embodiment 11 of the present invention will be described in detail with reference to FIGS. 14A and 14B. FIG. 14A is a cross-sectional view of a substantial portion of a semiconductor element of a semiconductor device according to Embodiment 11 of the present invention. FIG. 14B is a cross-sectional view of a substantial portion where the semiconductor element of FIG. 14A is mounted on a circuit board.

As shown in FIGS. 14A and 14B, the semiconductor device of Embodiment 11 has first conductive layers 7 formed on element electrodes 1a of a semiconductor element 1Q, each first conductive layer 7 having a dielectric layer 4 and a resistive layer 6 separately formed thereon. A bump 3 is formed on the dielectric layer 4 so as to be opposed to the first conductive layers 7 with the dielectric layers 4 disposed therebetween and another bump 3 is formed on the resistive layers 6. Other configurations in Embodiment 11 are the same as in Embodiments 5 and 6.

According to Embodiment 11, it is possible to incorporate a parallel circuit, including a capacitor with a capacitance and a resistor with an electrical resistance, into the connection means itself, which uses bumps for connecting element electrodes of a semiconductor element and board electrodes of a circuit board. As a result, it is possible to readily form, for example, a CPU arithmetic circuit and an analog signal amplification circuit.

Note that in Embodiment 11 also, the first conductive layer 7, the dielectric layer 4 and the resistive layer 6, along with the bump 3, may be formed on the circuit board 2 side or on both the semiconductor element 1Q and the circuit board 2.

Embodiment 12

Figure 15A:
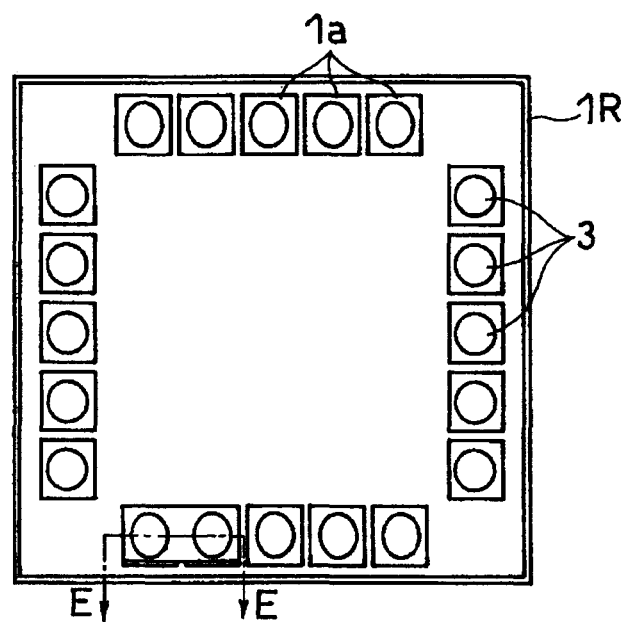
FIG. 15A is a plan view for the wiring surface side of a semiconductor element of a semiconductor device according to Embodiment 12 of the present invention.
Figure 15B:
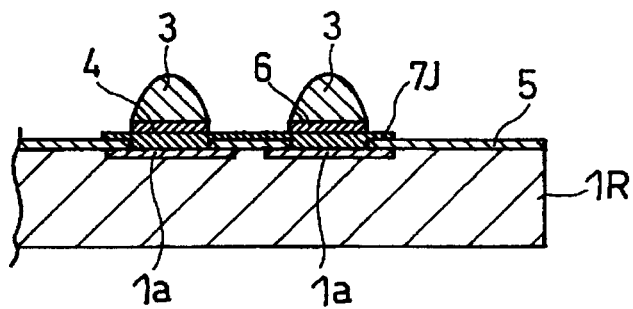
FIG. 15B is a cross-sectional view of a substantial portion of the semiconductor element.
Figure 15C:
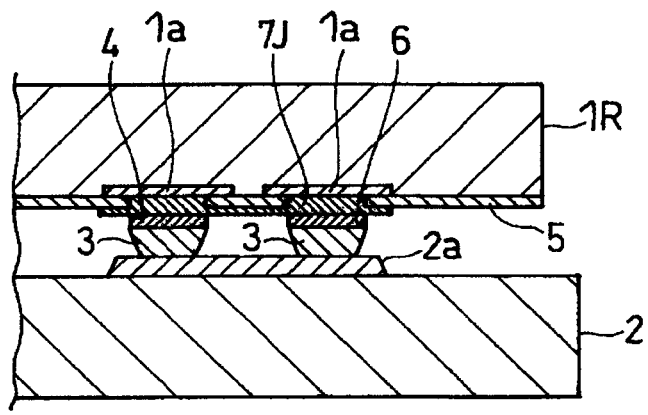
FIG. 15C is a cross-sectional view of a substantial portion where the semiconductor element is mounted on a circuit board.

Hereinafter, Embodiment 12 of the present invention will be described in detail with reference to FIGS. 15A, 15B and 15C. FIG. 15A is a plan view for the wiring surface side of a semiconductor element of a semiconductor device according to Embodiment 12 of the present invention. FIG. 15B is a cross-sectional view taken along line E-E of FIG. 15A. FIG. 15C is a cross-sectional view of a substantial portion where the semiconductor element of FIG. 15A is mounted on a circuit board.

As shown in FIGS. 15A to 15C, the semiconductor device of Embodiment 12 has first conductive layers 7J provided in the form of a single unit connecting a plurality of element electrodes 1a, each first conductive layer 7I in the single unit having a dielectric layer 4G and a resistive layer 6 separately formed thereon, and a bump 3 is formed so as to be opposed to the first conductive layer 7J with the dielectric layer 4 disposed therebetween and also the resistive layer 6 having another bump 3 formed thereon. Other configurations in Embodiment 12 are the same as in Embodiments 5 and 6.

According to Embodiment 12, it is possible to interconnect a plurality of element electrodes 1a by the shortest distance, and it is also possible to incorporate a parallel circuit, including a capacitor with a capacitance and a resistor with an electrical resistance, into the connection means itself, which uses bumps for connecting element electrodes of a semiconductor element to board electrodes of a circuit board. Thus, it is possible to enhance the stability of the high-frequency circuit.

Note that in Embodiment 12 also, the first conductive layer 7J, the dielectric layer 4 and the resistive layer 6, along with the bump 3, may be formed on the circuit board 2 side or on both the semiconductor element 1R and the circuit board 2.

Embodiment 13

Figure 16A:
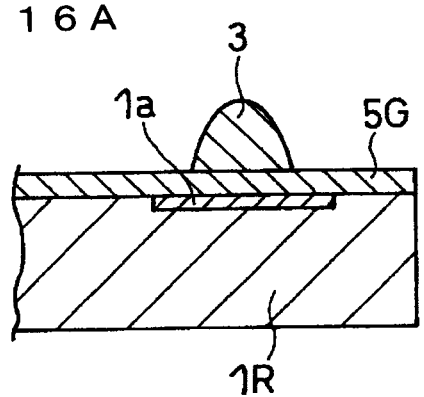
FIG. 16A is a cross-sectional view of a substantial portion of a semiconductor element of a semiconductor device according to Embodiment 13 of the present invention.
Figure 16B:
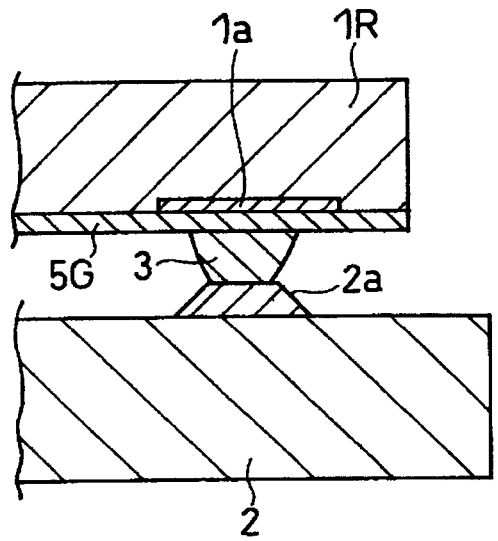
FIG. 16B is a cross-sectional view of a substantial portion where the semiconductor element is mounted on a circuit board.

Hereinafter, Embodiment 13 of the present invention will be described in detail with reference to FIGS. 16A and 16B. FIG. 16A is a cross-sectional view of a substantial portion of a semiconductor element of a semiconductor device according to Embodiment 13 of the present invention. FIG. 16B is a cross-sectional view of a substantial portion of the semiconductor device where the semiconductor element of FIG. 16A is mounted on a circuit board.

As shown in FIGS. 16A and 16B, the semiconductor device of Embodiment 13 has a protective film 5G formed to cover the wiring surface of the semiconductor element 1R as well as the element electrodes 1a, and bumps 3 provided so as to be opposed to the element electrodes 1a with the protective film 5G disposed therebetween. Here, the protective film 5G is made of a dielectric material such as polyimide, and the element electrode 1a, the protective film 5G, and the bump 3 form a parallel-plate capacitor. Specifically, in Embodiment 13, the dielectric layer 4 is formed of exactly the same material as the protective film 5G.

According to Embodiment 13, the dielectric layer forming a parallel-plate capacitor together with the element electrode 1a and the bump 3 can be formed by simply forming the protective film 5G covering the element electrodes 1a as well. Thus, the dielectric layer can be formed without increasing man-hours. Also, since the dielectric layer is made of exactly the same material as the protective film 5G, the need to additionally prepare a material for the dielectric layer is eliminated. Thus, it is possible to minimize increase in man-hours as well as efforts to prepare and store the material.

Embodiment 14

Figure 17A:
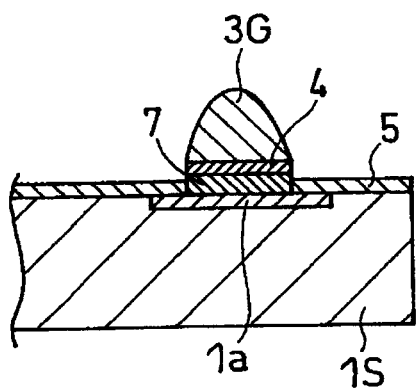
FIG. 17A is a cross-sectional view of a substantial portion of a semiconductor element of a semiconductor device according to Embodiment 14 of the present invention.
Figure 17B:
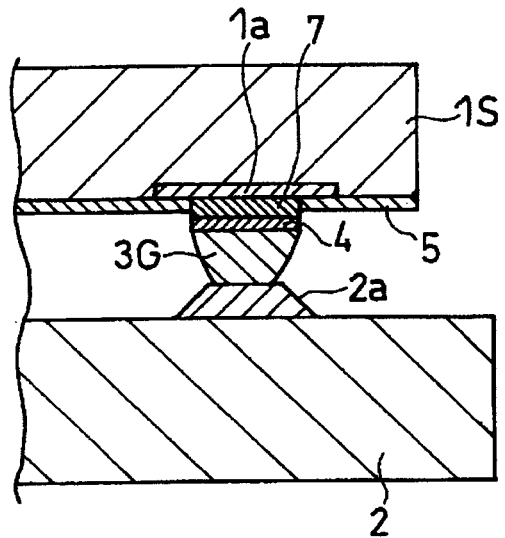
FIG. 17B is a cross-sectional view of a substantial portion where the semiconductor element is mounted on a circuit board.

Hereinafter, Embodiment 14 of the present invention will be described in detail with reference to FIGS. 17A and 17B. FIG. 17A is a cross-sectional view of a substantial portion of a semiconductor element of a semiconductor device according to Embodiment 14 of the present invention. FIG. 17B is a cross-sectional view of a substantial portion where the semiconductor element of FIG. 17A is mounted on a circuit board.

As shown in FIGS. 17A and 17B, the semiconductor device of Embodiment 14 has first conductive layers 7 formed on element electrodes 1a of a semiconductor element 1S, each first conductive layer 7 having formed thereon a dielectric layer 4 on which a bump 3G is formed so as to be opposed to the element electrode 1a with the dielectric layer 4 disposed therebetween. Here, the bump 3G is formed using a different material from the first conductive layer 7, more specifically, a softer material than the first conductive layer 7. Other configurations in Embodiment 14 are the same as in Embodiment 5. For example, even when the bump 3G and the first conductive layer 7 are made of a mixture of epoxy resin and silver, the flexibility of the bump 3G can be increased by causing the bump 3G to contain epoxy resin in a larger amount than that contained in the first conductive layer 7. As a result, it is possible to absorb stress generated when connecting the board electrodes 2a of the circuit board 2 and the element electrodes 1a by means of the bumps 3G. Thus, for example, it is possible to prevent the element electrodes 1a from being damaged at the time of connections, thereby increasing the reliability of the semiconductor device.

Note that in Embodiment 14 also, the first conductive layer 7, the dielectric layer 4, and the bump 3G may be formed on the circuit board 2 side or on both the semiconductor element 1S and the circuit board 2.

Embodiment 15

Figure 18:
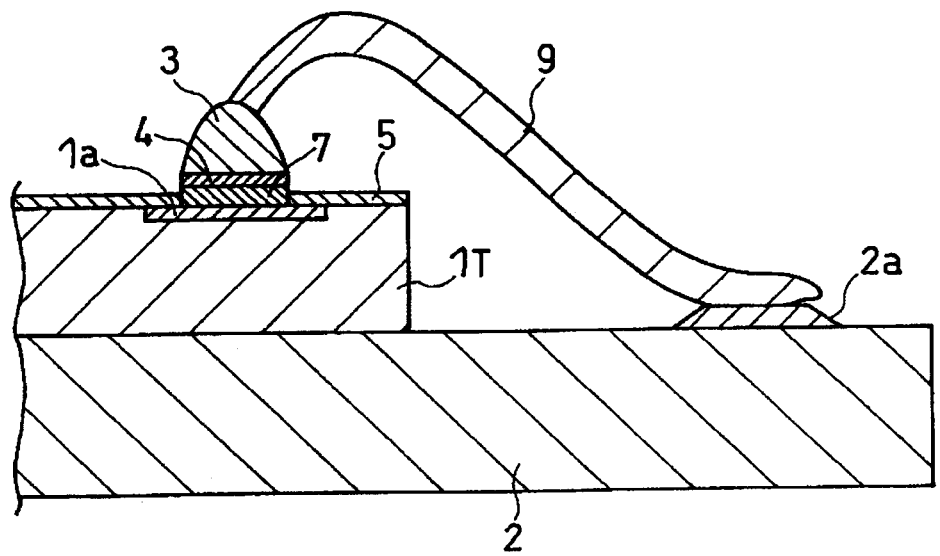
FIG. 18 is a cross-sectional view of a substantial portion where a semiconductor element of a semiconductor device according to Embodiment 15 of the present invention is mounted on a circuit board.

Hereinafter, Embodiment 15 of the present invention will be described in detail with reference to FIG. 18. FIG. 18 is a cross-sectional view of a substantial portion of a semiconductor device according to Embodiment 13 of the present invention.

As shown in FIG. 18, the semiconductor device of Embodiment 15 has first conductive layers 7 formed on element electrodes 1a of a semiconductor element 1T, each first conductive layer 7 having formed thereon a dielectric layer 4 on which a bump 3 is formed so as to be opposed to the element electrode 1a with the dielectric layer 4 disposed therebetween. The bump 3 is connected to the board electrode 2a of the circuit board 2 via a bonding wire 9.

According to Embodiment 15, it is possible to incorporate a parallel-plate capacitor into connection means itself, which uses the bumps 3 for connecting element electrodes 1a of the semiconductor element 1T and the board electrodes 2a of the circuit board 2 even in a semiconductor device which essentially requires wire-bonding connections as in a multi-layered structure.

Note that in Embodiment 15 also, it is obvious that the resistive layer 6 may be provided in place of the dielectric layer 4 or along with the dielectric layer 4.

Hereinafter, a method for manufacturing the semiconductor device in each embodiment will be more specifically described with reference to FIG. 19. While FIG. 19 illustrates the case where the semiconductor device of Embodiment 1 is manufactured, the semiconductor devices of the other embodiments can be manufactured in similar manners.

Figure 19A:
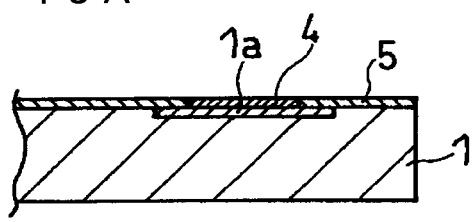
FIG. 19A is a cross-sectional view of a substantial portion, illustrating a step for manufacturing a semiconductor device of the present invention.

First, as shown in FIG. 19A, the dielectric layer 4 is formed on the element electrode 1a of the semiconductor element 1 by printing, ink-jetting, or stereolithography. The material of the dielectric layer 4 can be, for example, an epoxy resin base material containing silica filler or barium titanate. Thereafter, if necessary, depending on the material of the dielectric layer 4, the semiconductor element 1 is placed in a furnace to thermally cure the dielectric layer 4.

Figure 19B:
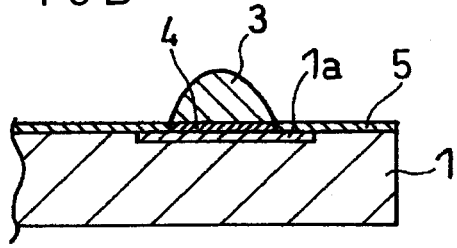
FIG. 19B is a cross-sectional view of a substantial portion, illustrating a step for manufacturing the semiconductor device of the present invention.

Then, as shown in FIG. 19B, the bump 3 is formed by printing, ink-jetting, or stereolithography. The material of the bump 3 is preferably a low-electrical resistance material such as silver or copper paste.

Figure 19C:
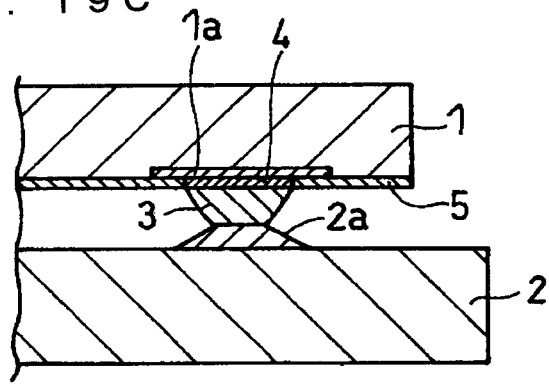
FIG. 19C is a cross-sectional view of a substantial portion, illustrating a step for manufacturing the semiconductor device of the present invention.

Then, as shown in FIG. 19C, the bumps 3 and the board electrodes 2 are joined in alignment between corresponding pairs of bumps 3 and board electrodes 2a of the circuit board 2. At this time, heating is performed under pressure as necessary.

Figure 19D:
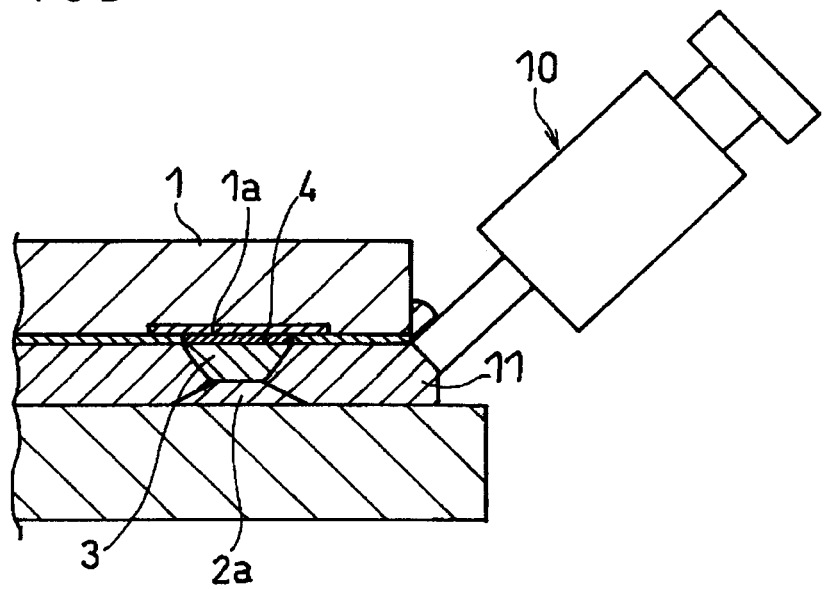
FIG. 19D is a cross-sectional view of a substantial portion, illustrating a step for manufacturing the semiconductor device of the present invention.
Figure 20A:
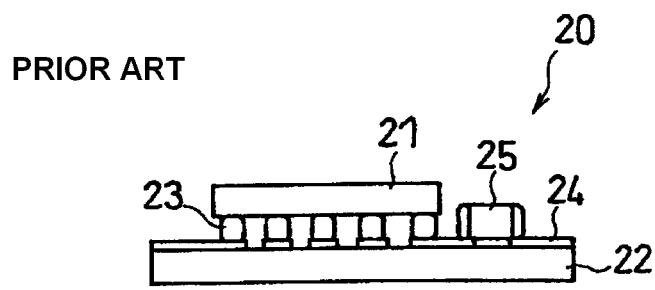
FIG. 20A is a side view of a conventional semiconductor device.
Figure 20B:
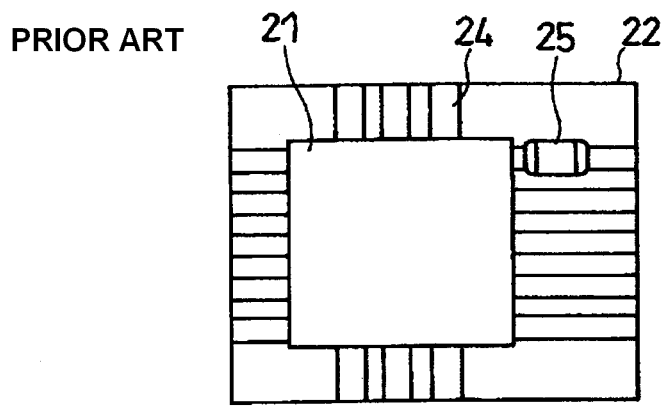
FIG. 20B is a plan view of the conventional semiconductor device.

In addition, as shown in FIG. 19D, sealing resin 11 is injected between the semiconductor element 1 and the circuit board 2 by a dispenser 10. In this manner, by sealing the gap between the semiconductor element 1 and the circuit board 2 with the sealing resin 11, it becomes possible to enhance the strength of the semiconductor device to resist external force and the reliability of connections between electrodes.

As described in detail above, according to the semiconductor device of the present invention, since a parallel-plate capacitor can be incorporated into the connection means itself, which uses the bumps for connecting the element electrodes of the semiconductor element and the board electrodes of the circuit board, it is possible to achieve stable signal transmission in a semiconductor device which is particularly required to operate at high speed and at high frequency. Also, in addition to the parallel-plate capacitor, a resistor can be incorporated into the connection means as well, therefore making it also possible to ensure further stable semiconductor element characteristics. Furthermore, since the need to provide additional capacitance components as in conventional semiconductor devices is eliminated, it is possible to enhance ease of mounting of semiconductor elements onto the circuit board. As a result, cost reduction can also be achieved.

Industrial Applicability

The present invention is applicable to the case where semiconductor elements are connected to a circuit board using bumps.

The invention claimed is:

1. A semiconductor device comprising:
a semiconductor element having a plurality of element electrodes formed thereon;
a circuit board having board electrodes respectively corresponding to the element electrodes formed thereon and having the semiconductor element mounted thereon; and
bumps each of which is provided on at least one of the element electrode and the board electrode, and connects together the element electrode and the board electrode corresponding to each other when the semiconductor element is mounted on the circuit board, wherein,
at least one of a dielectric layer and a resistive layer is provided between at least one of the bumps and the element or board electrode on which the at least one of the bumps is provided,
said semiconductor device further comprising a first conductive layer between the dielectric or resistive layer and the element or board electrode that has the dielectric or resistive layer provided thereon, the first conductive layer having a plane area larger than an area of a junction with the element or board electrode that has the first conductive layer provided thereon, the dielectric layer having a plane area equal to that of the first conductive layer, and a second conductive layer is provided between a bump and the dielectric layer, the second conductive layer having a plane area equal to that of the first conductive layer.

2. The semiconductor device according to claim 1, wherein the at least one of the dielectric layer and the resistive layer has a larger plane area than the element or board electrode that has the dielectric or resistive layer provided thereon.

3. The semiconductor device according to claim 1, wherein the element electrode and the board electrode have their opposing surfaces formed simply by single flat surfaces.

4. The semiconductor device according to claim 1, wherein the dielectric layer is provided between at least one of the bumps and the element or board electrode that has the at least one of the bumps provided thereon, and the resistive layer is provided between at least another one of the bumps and the element or board electrode that has the at least another one of the bumps provided thereon.

5. The semiconductor device according to claim 1, wherein each of the bumps has its surface bonded to the second conductive layer such that the surface's center is not located on the element or board electrode that has the bump provided thereon.

6. The semiconductor device according to claim 1, wherein the dielectric layer is formed by providing a protective film made of an insulator on the element electrodes, the protective film protecting the surface of the semiconductor element.

7. The semiconductor device according to claim 1, wherein the bumps are formed of a softer material than the first conductive layer.

8. The semiconductor device according to claim 1, wherein the bumps each of which is provided on the element electrode and connected to the board electrode.

* * * * *